(12) United States Patent
Tweet et al.

(10) Patent No.: US 7,018,882 B2
(45) Date of Patent: Mar. 28, 2006

(54) METHOD TO FORM LOCAL "SILICON-ON-NOTHING" OR "SILICON-ON-INSULATOR" WAFERS WITH TENSILE-STRAINED SILICON

(75) Inventors: Douglas J. Tweet, Camas, WA (US); Sheng Teng Hsu, Camas, WA (US); Jer-Shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/807,931

(22) Filed: Mar. 23, 2004

(65) Prior Publication Data

US 2005/0214997 A1 Sep. 29, 2005

(51) Int. Cl.
*H01L 21/8238* (2006.01)
*H01L 21/336* (2006.01)

(52) U.S. Cl. .................. 438/199; 438/289; 438/303

(58) Field of Classification Search ............... 438/487, 438/283, 287, 289, 300, 303, 305, 308, 199
See application file for complete search history.

(56) References Cited

U.S. PATENT DOCUMENTS

| | | | |
|---|---|---|---|
| 6,583,015 B1 * | 6/2003 | Fitzgerald et al. | 438/287 |
| 6,878,610 B1 * | 4/2005 | Lin et al. | 438/478 |
| 6,881,635 B1 * | 4/2005 | Chidambarrao et al. | 438/300 |

OTHER PUBLICATIONS

Harrison et al., *Highly performant double gate MOSFET realized with SON process*, IEDM 03-449, p18.6.1 (2003).
Yin, et al., *Strain relaxation of SiGe islands on compliant oxides*, J. Appl. Phys. 91, p. 9716 (2002).
R. Chau et al., *A 50nm Depleted-Substrate CMOS Transistor*, IEDM, p. 621, 2001.
Tezuka et al., *A Novel Fabrication Technique of Ultrathin and Relaxed SiGe Buffer Layers with High Ge Fraction for Sub-100nm Strained Silicon-on-Insulator MOSFETs*, Jpn. J. Appl. Phys. 40, p. 2866 (2001).
M. Jurczak, et al., *Silicon-on-Nothing (SON)—an innovative Process for Advanced CMOS*, IEEE Trans. El. Dev. vol. 47, pp2179-2187 (2000).
Mizuno et al., *Advanced SOI-MOSFETs with strained-Si channel for high speed CMOS—electron/hole mobility enhancements*, 2000 Symposium on VLSI, p. 210.
Trinkaus et al., *Strain relaxation mechanism for hydrogen-implanted $Si_{1-x}Ge_x/Si$ (100) heterostructures*, Appl. Phys. Lett., 76, p. 3552, (2000).
M. Jurczak et al., *SON (Silicon on Nothing)—A New Device Architecture for the ULSI Era*, VLSI Tech. Dig., p. 29, (1999).
R. Koh, *Buried Layer Engineering to Reduce the Drain-Induced Barrier Lowering of Sub-0.05um SOI-MOSFET* Jpn. J. Appl. Phys., vol. 38, P. 2294 (1999).
Mantl et al., *Strain relaxation of epitaxial SiGe layers on Si (100) improved by hydrogen implantation*, Nuclear Instruments and Methods in Physics Research B 147, p. 29, (1999).

(Continued)

*Primary Examiner*—Walter L. Lindsay, Jr.
(74) *Attorney, Agent, or Firm*—Robert D. Varitz, PC

(57) ABSTRACT

A method of forming a substrate for use in IC device fabrication includes preparing a silicon substrate, including doping a bulk silicon (100) substrate with ions taken from the group of ions to form a doped substrate taken from the group of doped substrates consisting of n-type doped substrates and p-type doped substrates; forming a first relaxed SiGe layer on the silicon substrate; forming a first tensile-strained silicon cap on the first relaxed SiGe layer; forming a second relaxed SiGe layer on the first tensile-strained silicon cap; forming a second tensile-strained silicon cap on the second relaxed SiGe layer; and completing an IC device.

16 Claims, 2 Drawing Sheets

OTHER PUBLICATIONS

Paul, *Silicon germanium heterostructures in electronics: the present and the future*, Thin Solid Films, 321, p. 172 (1998).

Rim et al., *Transconductance enhancement in deep submicron strained-Si n-MOSFETs*, IEDM Proc. p. 707 (1998).

Welser et al., *Electron mobility enhancement in strained-Si N-type metal-oxide-semiconductor field-effect transistors*, IEEE EDL-15, #3, p. 100, (1994).

Rim et al., *Enhanced hole mobilities in surface-channel strained-Si p-MOSFETs*, IEDM Proc. p. 517 (1995).

* cited by examiner

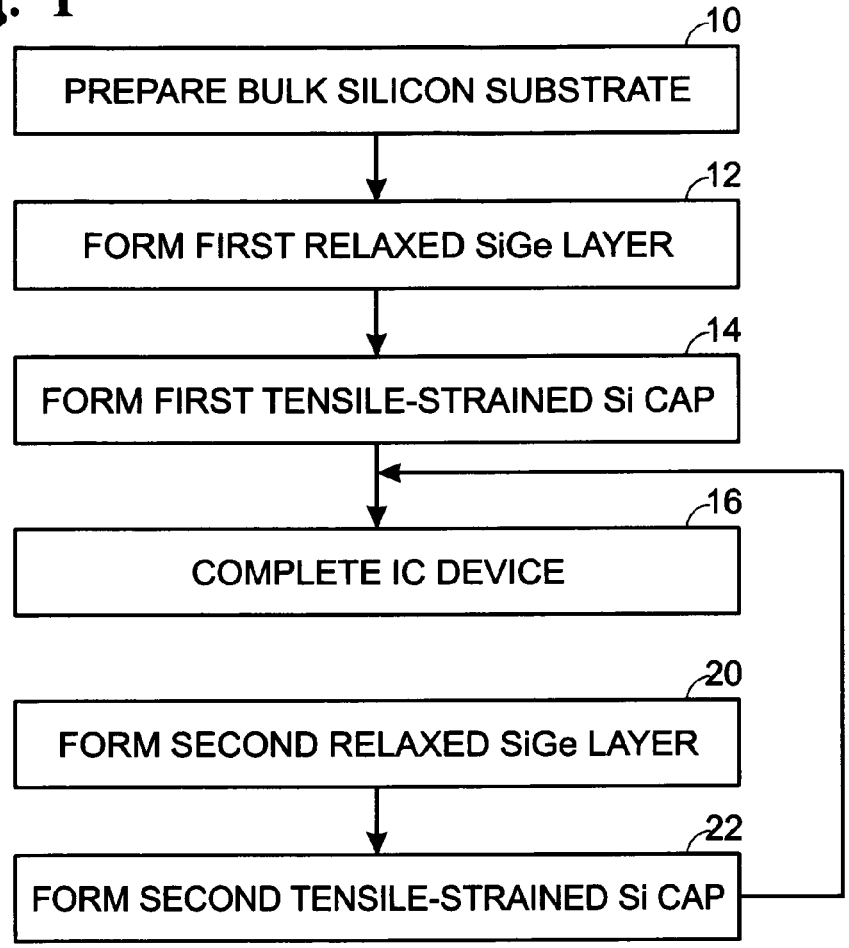
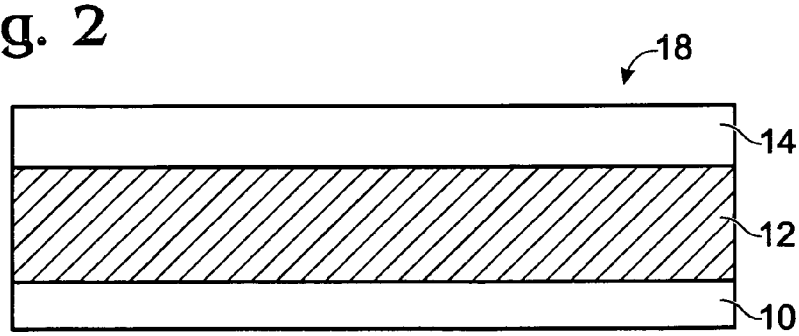

METHOD TO FORM LOCAL "SILICON-ON-NOTHING" OR "SILICON-ON-INSULATOR" WAFERS WITH TENSILE-STRAINED SILICON

FIELD OF THE INVENTION

This invention relates to enhanced mobility, low power MOSFET device, and specifically to a method of making same using a relaxed SiGe layer, formed over SOI or SON.

BACKGROUND OF THE INVENTION

MOSFET fabricated on silicon on insulator (SOI) substrate provides an advantage for high speed and low power applications because of the low parasitic capacitance and the low body effect present in SOI structures. As CMOS IC technology enters the sub-50 nm range, the silicon channel and the buried oxide thicknesses must be less than 50 nm and 100 nm, respectively, in order to prevent the short channel effect (SCE), as described by R. Koh in *Buried Layer Engineering to Reduce the Drain-Induced Barrier Lowering of Sub-0.05 um SOI-MOSFET* Jpn. J. Appl. Phys., Vol. 38, P. 2294 (1999); and R. Chau et al., *A 50 nm Depleted-Substrate CMOS Transistor*, IEDM, p. 621, 2001.

SiGe MOS transistors have been fabricated on tensile-strained silicon. The structure consists of a thick layer of graded $Si_{1-x}Ge_x$ where x varies from zero at the bottom of the layer to about 0.3 at the top of the layer. The total layer thickness is on the order of 1 μm to 5 μm. The top of this graded SiGe is relaxed. A layer of 200 nm to one micron of relaxed $Si_{1-x}Ge_x$ is grown on top of the graded SiGe layer, and a tensile-strained silicon epitaxial layer is deposited on the $Si_{1-x}Ge_x$ layer. This structure is able to enhance the field effective electron mobility by ~80% from that of a pure silicon device, Welser et al., *Electron mobility enhancement in strained-Si N-type metal-oxide-semiconductor field-effect transistors*, IEEE EDL-15, #3, p. 100, (1994); Rim et al., *Transconductance enhancement in deep submicron strained-Si n-MOSFETs*, IEDM Proc. p. 707 (1998). For pMOST, an effective hole mobility improvement of 30% over bulk silicon has been obtained, Rim et al., *Enhanced hole mobilities in surface-channel strained-Si p-MOSFETs*, IEDM Proc. p. 517 (1995). However, the graded SiGe layers relax by generation and propagation of dislocations. This process typically results in an unacceptably high density of threading dislocations in the top SiGe and strained silicon of ~1×10$^7$ cm$^{-2}$, Paul, *Silicon germanium heterostructures in electronics: the present and the future*, Thin Solid Films, 321, p. 172 (1998), and references therein.

SiGe/SOI (silicon-on-insulator) transistors fabricated on a similar structure, but having silicon oxide buried in the relaxed graded SiGe layer, have also been fabricated, Mizuno et al., *Advanced SOI-MOSFETs with strained—Si channel for high speed CMOS—electron/hole mobility enhancements*, 2000 Symposium on VLSI, p. 210. The gain of hole mobility and electron mobility of this SiGe/SOI structure is higher than that of silicon control transistor by 45% and 60%, respectively. This structure is very complex, and the crystalline defect density is too high for large-scale integrated circuit application.

Another approach to form relaxed SiGe with a tensile strained silicon cap is to use SOI substrates. One method requires deposition of a SiGe layer on SOI, using a high temperature oxidation to form a relaxed SiGe film with high Ge content, Tezuka et al., *A Novel Fabrication Technique of Ultrathin and Relaxed SiGe Buffer Layers with High Ge Fraction for Sub-100 nm Strained Silicon-on-Insulator MOSFETs*, Jpn. J. Appl. Phys. 40, p. 2866 (2001). Strained silicon may then be grown on the relaxed SiGe film. Another method uses a so-called "compliant oxide" to fabricate relaxed SiGe films on an insulating substrate, Yin, et al., *Strain relaxation of SiGe islands on compliant oxides*, J. Appl. Phys. 91, p. 9716 (2002).

Another approach to form a relaxed SiGe layer having a tensile strained silicon cap thereon is to use hydrogen ion implantation, Mantl et al., *Strain relaxation of epitaxial SiGe layers on Si (100) improved by hydrogen implantation*, Nuclear Instruments and Methods in Physics Research B 147, p. 29, (1999); Trinkaus et al., *Strain relaxation mechanism for hydrogen-implanted $Si_{1-x}Ge_x$/Si (100) heterostructures*, Appl. Phys. Lett., 76, p. 3552, (2000). A strained, dislocation-free SiGe layer is grown and then implanted with a high concentration of hydrogen ions so that the hydrogen is at, or just below, the SiGe/Si interface. The wafer is then annealed. During annealing, the hydrogen forms cavities at the SiGe/Si interface, and a dense network of misfit dislocations form. The result is a very efficient relaxation of the SiGe layer, resulting in a low density of threading dislocations. Once a relaxed SiGe layer is formed, a tensile-strained silicon cap may be grown Mantl et al., Trinkaus et al., supra, or a relaxed, second SiGe layer may be grown, followed by deposition of a tensile-strained silicon cap.

Devices grown on SOI substrates have shown good electrical properties with low power consumption. However, SOI substrates are very expensive. An alternative is to use a conventional bulk silicon substrate and produce a buried insulating layer only in certain local regions, such as in the channel region. This can save cost and also facilitates system-on-chip integration. One approach to this is called "Silicon-on-Nothing" (SON), Jurczak et al., *SON (Silicon On Nothing)—A new device architecture for the ULSI era*, 1999 Symposium on VLSI, p. 29 (1999); Jurczak et al., *Silicon-on-Nothing (SON)—an innovative process for advanced CMOS*, IEEE Trans. El. Dev. Vol. 47, p. 2179 (2000). In this method, a strained, epitaxial SiGe layer is grown on a bulk silicon substrate, and an unstrained silicon cap is deposited on the epi-silicon. The wafer is patterned and etched with an etchant that highly selectively removes SiGe, but does not etch silicon. This leaves the silicon cap suspended over a gap. This gap may be left empty (silicon-on-nothing) or filled with a dielectric (local SOI).

SUMMARY OF THE INVENTION

A method of forming a substrate for use in IC device fabrication includes preparing a silicon substrate, including doping a bulk silicon (100) substrate with ions taken from the group of ions to form a doped substrate taken from the group of doped substrates consisting of n-type doped substrates and p-type doped substrates; forming a first relaxed SiGe layer on the silicon substrate; forming a first tensile-strained silicon cap on the first relaxed SiGe layer; forming a second relaxed SiGe layer on the first tensile-strained silicon cap; forming a second tensile-strained silicon cap on the second relaxed SiGe layer; and completing an IC device.

It is an object of the invention to provide a local tensile-strained silicon-on-nothing (T-SON), or local tensile-strained silicon-on-insulator (T-SOI) wafers for use in CMOS transistors with enhanced electron and hole mobilities.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 is a block diagram of the method of the invention.
FIG. 2 depicts a step in a first embodiment of the method of the invention.

DETAILED DESCRIPTION OF THE PREFERRED EMBODIMENTS

Figure 3:
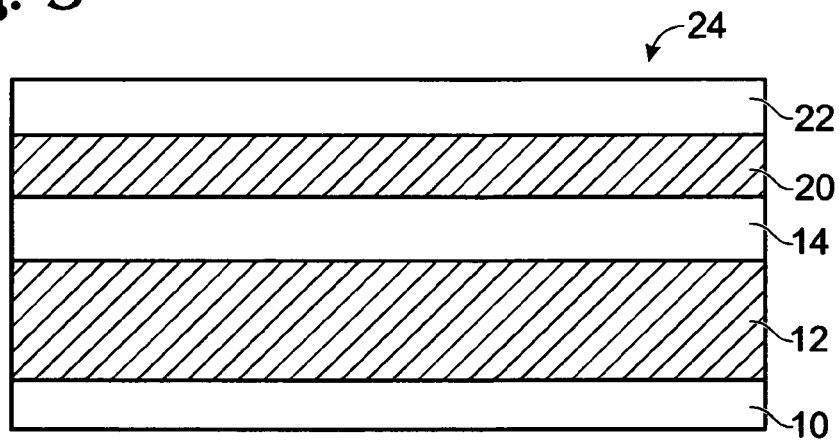
FIG. 3 depicts a step in a second embodiment of the method of the invention.

Referring to FIGS. 1 and 2, a n-type or p-type bulk silicon (100) substrate 10 is prepared. A first relaxed SiGe layer 12 is prepared with low defect density on bulk silicon (100) substrate 10. Any state-of-the-art technique may be used, such as the graded SiGe method, described above, or the hydrogen implantation method, also described above. The thickness may be from 200 nm to 5 µm, with the thinner range preferred. The Ge content at the top of the SiGe region may be from between about 10% Ge to 100% Ge, with a typical value in a range of between about 20% to 30%. A tensile-strained, low-defect silicon cap 14 is then grown on top of relaxed SiGe layer 12, and has a thickness in the range of between about 10 nm to 50 nm. The resulting structure is depicted in FIG. 2 at 18. After removal of a portion of SiGe layer 12, a CMOS device may be formed on substrate 18.

The advantage of the method of the invention is that it provides a technique for forming a very thin relaxed SiGe layer. Such a layer is particularly useful in applications where the buried oxide layer or a tunnel, which is used with fabrication of IC devices as described in the prior art cited herein, need to be very thin, e.g., less than 100 nm. It is difficult to form a relaxed SiGe layer of less than 100 nm thickness on a silicon substrate, so, using the method of the invention, a second relaxed SiGe layer and a second tensile-strained silicon layer may be grown on the first SiGe and silicon layers, which second SiGe layer may be grown to any required thickness.

Referring to FIGS. 1 and 3, a second form of the substrate may be fabricated according to the method of the invention. Substrate preparation is as follows: after formation of first relaxed SiGe layer 12 and first tensile-strained silicon cap 14, as described in connection with FIG. 2, a second relaxed epitaxial SiGe layer 20 is grown. Layer 20 is formed with a thickness in a range of between about 25 nm to 300 nm, as required by the final device performance. A second tensile-strained silicon cap 22 is grown on second relaxed SiGe layer 20, and has a thickness in a range of between about 10 nm to 50 nm, resulting in a second form of the substrate of the method of the invention, depicted at 24.

Figure 4:
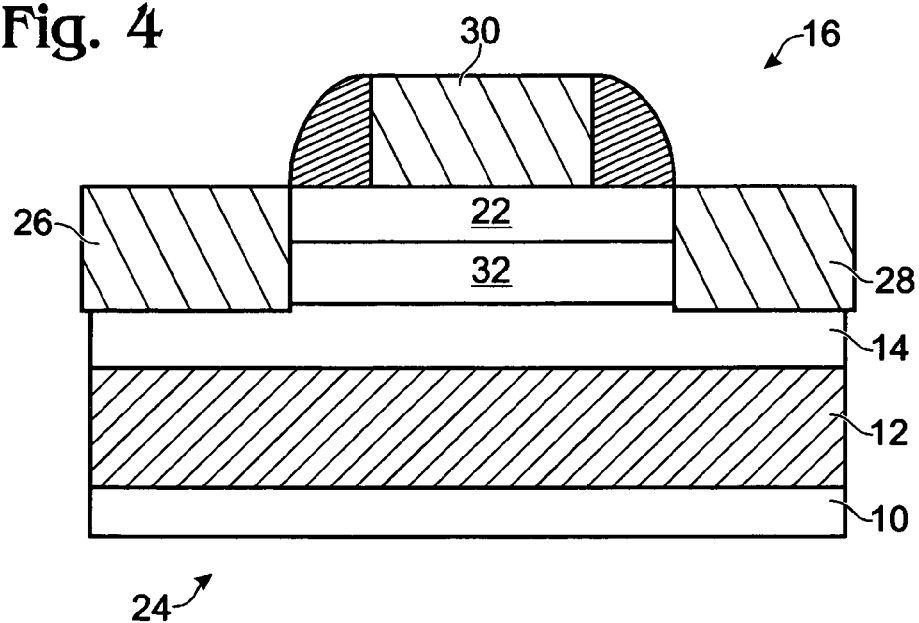
FIG. 4 depicts a CMOS device constructed on a substrate of the method of the invention.

Referring to FIG. 4, well ion implantation, threshold voltage adjustment, STI device isolation, gate oxidation, gate electrode and sidewall nitride formation may be achieved by state-of-the-art processes. Gate oxide is completely etched away after the sidewall nitride is formed. Exposed second tensile-strained silicon cap 22 is then etched to expose second relaxed SiGe layer 20 in source region 26 and a drain region 28. SiGe layer 20, at the source and drain region and the SiGe layer located beneath the gate and nitride spacers is selectively laterally etched. Second tensile-strained silicon cap 22 located under a gate electrode 30 is supported with the gate electrode bridging the STI borders over the active areas. A resulting tunnel 32 may be left empty, i.e., T-SON, or may be filled with a dielectric, i.e., T-SOI. Selective epitaxial growth of the source/drain regions is performed and these areas are doped by ion implantation followed by an appropriate RTA. The source and drain regions in this method of the invention are in electrical contact with the first tensile-strained Si Cap layer. A CMOS structure, generally depicted in FIG. 4, may be fabricated according to the state-of-the-art techniques described in Jurczak et al. (2000). Other IC devices may be formed on a substrate fabricated according to the method of the invention, as the MOSFET described in *Fabrication of Silicon-on-Nothing (SON) MOSFET using Selective Etching of $Si_{1-x}Ge_xLayer$*, of Lee et al., U.S. patent application Ser. No. 10/625,065, filed Jul. 22, 2003; or the structures described in *Silicon-on-Nothing Fabrication Process*, of Lee et al., U.S. patent application Ser. No. 10/441,675, filed May 20, 2003; or *Highly performant double gate MOSFET realized with SON process*, Harrison et al., IEDM 03–449, p18.6.1 (2003).

Thus, a method of forming a tensile-strained silicon substrate has been disclosed. It will be appreciated that further variations and modifications thereof may be made within the scope of the invention as defined in the appended claims.

We claim:

1. A method of forming a substrate for use in CMOS device fabrication comprising:
   prepare a silicon substrate, including doping a bulk silicon (100) substrate with ions taken from the group of ions to form a doped substrate taken from the group of doped substrates consisting of n-type doped substrates and p-type doped substrates;
   forming a first relaxed SiGe layer on the silicon substrate;
   forming a first tensile-strained silicon cap on the first relaxed SiGe layer;
   forming a second relaxed SiGe layer on the first tensile-strained silicon cap;
   forming a second tensile-strained silicon cap on the second relaxed SiGe layer; and
   completing a CMOS device on the tensile-strained silicon cap, wherein the CMOS device includes a source region and a drain region which are both in electrical contact with a tensile-strained silicon cap, including well ion implantation, threshold voltage adjustment, STI device isolation, gate oxidation, gate electrode and sidewall nitride formation; etching of gate oxide after formation of sidewall nitride; etching of exposed second tensile-strained silicon cap to expose second relaxed SiGe layer in the source region and the drain region; selectively laterally etching of any SiGe layer at the source and drain region and selectively laterally etching of any SiGe layer located beneath the gate and nitride spacers, forming a resulting tunnel, which is left empty or filled with a dielectric.

2. The method of claim 1 wherein said forming a first relaxed SiGe layer on the silicon substrate includes forming a graded, relaxed SiGe layer to a thickness of between about 200 nm to 5 µm, and containing between about 20% to 30% Ge.

3. The method of claim 1 wherein said forming a first tensile-strained silicon cap includes forming a tensile-strained silicon cap to a thickness of between about 10 nm to 50 nm.

4. The method of claim 1 wherein said forming a second relaxed SiGe layer on the silicon substrate includes forming a relaxed SiGe layer to a thickness of between about 25 nm to 300 nm.

5. The method of claim 1 wherein said forming a second tensile-strained silicon cap includes forming a second tensile-strained silicon cap having a thickness of between about 10 nm to 50 nm.

6. A method of forming a substrate for use in CMOS fabrication comprising:
- preparing a silicon substrate, including doping a bulk silicon (100) substrate with ions taken from the group of ions to form a doped substrate taken from the group of doped substrates consisting of n-type doped substrates and p-type doped substrates;
- forming a first relaxed SiGe layer on the silicon substrate;
- forming a first tensile-strained silicon cap on the first relaxed SiGe layer; and
- completing a CMOS device on the tensile-strained silicon cap, wherein the CMOS device includes a source region and a drain region which are both in electrical contact with a tensile-strained silicon cap, including well ion implantation, threshold voltage adjustment, STI device isolation, gate oxidation, gate electrode and sidewall nitride formation; etching of gate oxide after formation of sidewall nitride; etching of exposed second tensile-strained silicon cap to expose second relaxed SiGe layer in the source region and the drain region; selectively laterally etching of any SiGe layer at the source and drain region and selectively laterally etching of any SiGe layer located beneath the gate and nitride spacers, forming a resulting tunnel, which is left empty or filled with a dielectric.

7. The method of claim 6 wherein said forming a first relaxed SiGe layer on the silicon substrate includes forming a relaxed SiGe layer to a thickness of between about 200 nm to 5 μm.

8. The method of claim 6 wherein said forming a first relaxed SiGe layer on the silicon substrate includes forming a graded relaxed SiGe layer, containing between about 20% to 30% Ge.

9. The method of claim 6 wherein said forming a first tensile-strained silicon cap includes forming a tensile-strained silicon cap to a thickness of between about 10 nm to 50 nm.

10. The method of claim 6 which includes forming a second relaxed SiGe layer on the first tensile-strained silicon cap and forming a second tensile-strained silicon cap on the second relaxed SiGe layer.

11. The method of claim 10 wherein said forming a second relaxed SiGe layer on the silicon substrate includes forming a relaxed SiGe layer to a thickness of between about 25 nm to 300 nm.

12. The method of claim 10 wherein said forming a second tensile-strained silicon cap includes forming a second tensile-strained silicon cap having a thickness of between about 10 nm to 50 nm.

13. A method of forming a substrate for use in CMOS fabrication comprising:
- preparing a silicon substrate, including doping a bulk silicon (100) substrate with ions taken from the group of ions to form a doped substrate taken from the group of doped substrates consisting of n-type doped substrates and p-type doped substrates;
- forming a first relaxed SiGe layer on the silicon substrate, including forming a graded, relaxed SiGe layer to a thickness of between about 200 nm to 5 μm, and containing between about 10% and 100% Ge, and preferably between about 20% to 30% Ge;
- forming a first tensile-strained silicon cap on the first relaxed SiGe layer having a thickness of between about 10 nm to 50 nm; and
- completing a CMOS device on the tensile-strained silicon cap, wherein the CMOS device includes a source region and a drain region which are both in electrical contact with a tensile-strained silicon cap, including well ion implantation, threshold voltage adjustment, STI device isolation, gate oxidation, gate electrode and sidewall nitride formation; etching of gate oxide after formation of sidewall nitride; etching of exposed second tensile-strained silicon cap to expose second relaxed SiGe layer in the source region and the drain region; selectively laterally etching of any SiGe layer at the source and drain region and selectively laterally etching of any SiGe layer located beneath the gate and nitride spacers, forming a resulting tunnel, which is left empty or filled with a dielectric.

14. The method of claim 13 which includes forming a second relaxed SiGe layer on the first tensile-strained silicon cap and forming a second tensile-strained silicon cap on the second relaxed SiGe layer.

15. The method of claim 14 wherein said forming a second relaxed SiGe layer on the silicon substrate includes forming a relaxed SiGe layer to a thickness of between about 25 nm to 300 nm.

16. The method of claim 14 wherein said forming a second tensile-strained silicon cap includes forming a second tensile-strained silicon cap having a thickness of between about 10 nm to 50 nm.

\* \* \* \* \*